United States Patent [19]

Pearce et al.

[11] 4,131,487
[45] Dec. 26, 1978

[54] GETTERING SEMICONDUCTOR WAFERS WITH A HIGH ENERGY LASER BEAM

[75] Inventors: Charles W. Pearce, Emmaus, Pa.; Vincent J. Zaleckas, Union, N.J.

[73] Assignee: Western Electric Company, Inc., N.Y.

[21] Appl. No.: 846,222

[22] Filed: Oct. 26, 1977

[51] Int. Cl.² .................................. H01L 21/265
[52] U.S. Cl. ................................ 148/1.5; 148/187; 219/121 L; 357/91
[58] Field of Search .............. 148/1.5, 187, 175; 219/121 L; 357/91

[56] References Cited

U.S. PATENT DOCUMENTS

| | | | |
|---|---|---|---|
| 3,997,368 | 12/1976 | Petroff et al. | 148/1.5 |
| 4,018,626 | 4/1977 | Schwuttle et al. | 148/1.5 |
| 4,069,068 | 1/1978 | Beyer et al. | 148/1.5 |

OTHER PUBLICATIONS

Bhatia et al., "Isolation Process . . . Devices", IBM-TDB, 19 (1977), 4171.
Poponiak et al., "Gettering . . . Implant . . . Epi . . . Layer", IBM-TDB, 19 (1976), 2052.
Shryrkov et al., "Local Laser Annealing . . . S/C Layers", Sov. Phys. Semicond., vol. 9 (1976), 3309 (Eng.).
Grinberg et al., ". . . Laser Radiation & Damage in S/C", Sov. Phys.-Solid State, 9 (1967), 1085.
Kutukova et al., "Laser Annealing of Implanted Si", Sov. Phys. Semicond., 10 (1976), 265.
J. F. Ready, "Effects of High Power Laser Radiation", Acad. Press., 1971, pp. 295-306.

*Primary Examiner*—L. Dewayne Rutledge
*Assistant Examiner*—Upendra Roy
*Attorney, Agent, or Firm*—Robert Y. Peters

[57] ABSTRACT

A semiconductor wafer from which devices, such as transistors, integrated circuits or the like, are to be formed is gettered. This is done by directing a high energy beam, such as a laser beam, on the surface of the wafer opposite to the surface on which the devices are to be formed. The beam is absorbed by such surface and produces lattice damage and strain in the region of such surface. The wafer is then heated at a temperature and for a time sufficient to produce a dislocation array adjacent to the region of damage. This relieves the strain and attracts mobile defects in the wafer toward the array and away from the surface of the wafer on which the devices are to be formed.

The beam may also be directed on the surface of the wafer where the semiconductor devices are to be formed so long as the beam avoids those portions of such surface where the devices are to be formed.

2 Claims, 14 Drawing Figures

FIG.-3 (PRIOR ART)
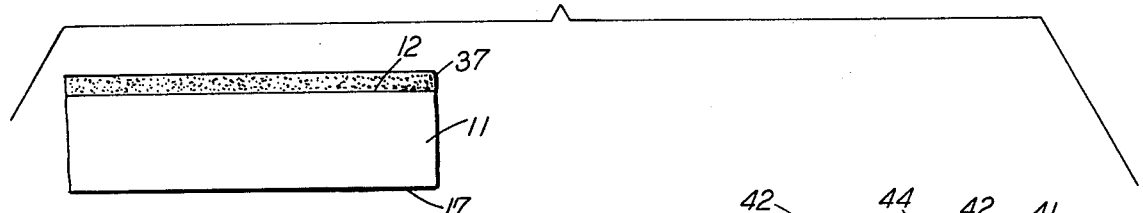
FIG.-3A
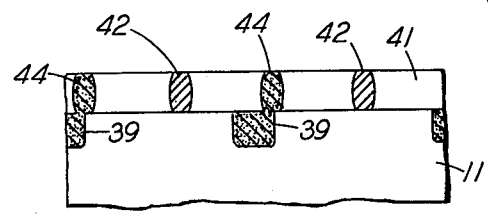
FIG.-3E
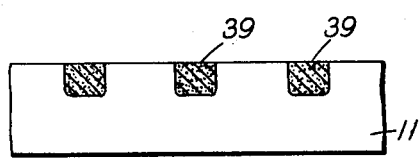
FIG.-3B
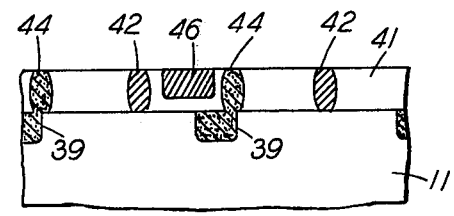
FIG.-3F
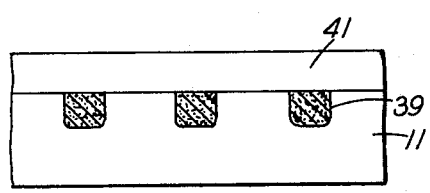
FIG.-3C
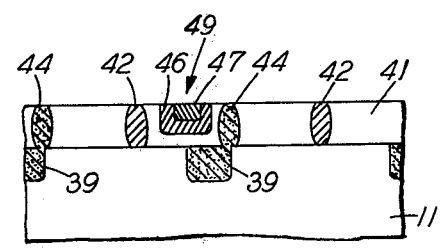
FIG.-3G
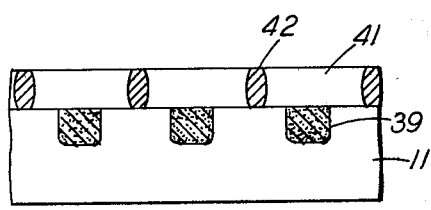
FIG.-3D

GETTERING SEMICONDUCTOR WAFERS WITH A HIGH ENERGY LASER BEAM

BACKGROUND OF THE INVENTION

1. Field of the Invention

This invention relates to gettering semiconductor wafers by directing a high energy beam on the wafers, and more particularly to gettering a silicon wafer by inducing lattice damage with a laser directed on, and absorbed by, a surface of the wafer.

2. Description of Prior Art

In the manufacture of semiconductor devices, such as transistors, integrated circuits or the like, semiconductor wafers are separated into the devices by scribing and breaking, sawing, etching or the like. From an economic standpoint, it is of the utmost importance to obtain the highest possible yield of good devices from each wafer. High yields obviously increase the productivity of workers and capital, decrease the unit cost of each device and avoid expenditures on costly capital equipment.

To improve device yields, a number of different gettering techniques have been used in the prior art. These techniques have been effective in reducing various mobile defects in the crystalline structure of wafers from which semiconductor devices are fabricated. Such reduction of these defects, which might include point, line, area, and volume defects, takes place at active or critical portions of the wafers where device processing will occur.

For example, area defects such as stacking faults have been eliminated in silicon devices by a gettering process that includes forming on the back surface of the wafer a stressed layer and then annealing the wafer for a time and temperature sufficient to diffuse nucleation sites to a region near the back surface. The stressed layer may be formed by depositing silicon nitride or aluminum oxide on the back surface of the wafer. Enhanced gettering is achieved, if prior to forming the stressed layer, phosphorus is diffused into the back surface. See U.S. Patent 3,997,368 to Petroff et al. assigned to Bell Laboratories.

Another gettering technique of the prior art is inducing lattice damage by grinding, lapping, grit blasting or incomplete removal of damage resulting from sawing a crystalline ingot into wafers. By so inducing lattice damage, point defects, such as metallic contaminants or out-of-place atoms, are reduced in the regions where devices are to be formed. In this technique, which also includes a heat treatment step, mobile defects migrate and are attached to dislocations resulting from the lattice damage.

Although the prior art technique of inducing lattice damage by grinding, lapping or grit blasting does improve yields, the abrasives used to apply the damage may actually contaminate the wafer. And the amount and uniformity of the damage is uncertain. Also, practical considerations usually limit this gettering technique to pre process use.

Still other gettering techniques of the prior art are ion implantation damage and oxygen precipitates intrinsic to the starting wafer.

These prior art gettering techniques do not have universal application. Some must be applied pre, mid or post process for maximum results, depending on the starting material and the particular processing technique. Also, some of these gettering techniques are incompatible with the particular processing technique or are simply too costly to use.

For example, the prior art lattice damage technique is not easily applied mid process because of the necessity of protecting the side of the wafer where semiconductor devices are to be formed.

When lattice damage is applied pre process in a bipolar process its effectiveness may be reduced by the high temperature furnace operations preceding critical base and emitter diffusions. This is particularly troublesome because gettering is most needed prior to these diffusions to reduce certain defects in the wafers and improve junction yields.

Gettering with pre process phosphorus diffusions is not compatible with later process steps such as epitaxy. This is because such phosphorus may be incorporated into the growing of epitaxial layers by autodoping. Also, such gettering usually requires masking or other protective measures to prevent such phosphorus from contaminating the active side of the wafer where devices are to be formed.

It is desirable to carry out gettering at any point in the process of making semiconductor devices. It is also desirable that such gettering not introduce contamination into the device, as often happens with some prior art techniques.

Additionally, precise control of the gettering (i.e., damage) is desirable so that it may be tailored to any process for fabricating semiconductor devices from wafers. And such control is of great importance in preventing wafer breakage during gettering. Also, it is desirable to be able to readily refresh gettering by an additional application of damage at any point in the process of fabricating the wafer into semiconductor devices.

SUMMARY OF THE INVENTION

It is, therefore, an object of this invention to provide new and improved methods of gettering semiconductor wafers with a high energy beam. Another object of this invention is the provision of methods of gettering a silicon wafer by inducing lattice damage with a laser directed on a surface of the wafer.

With these and other objects in view, the present invention contemplates a new method of gettering a semiconductor wafer having a surface on which semiconductor devices are to be formed. The method includes directing a high energy beam on the opposite surface of the wafer to produce lattice damage and strain in the region of such surface. Then, the wafer is heated at a temperature and for a time sufficient to produce a dislocation array adjacent to the region of damage. This relieves the strain and attracts contaminant impurities in the wafer toward the array and away from the surface of the wafer on which the devices are to be formed.

The high energy beam may also be directed to the surface of the wafer where the semiconductor devices are to be formed so long as the beam avoids those portions of such surface where the devices are to be formed.

BRIEF DESCRIPTION OF THE DRAWING

Other objects and advantages of the present invention may be more clearly understood by reference to the following detailed description and drawing, wherein:

FIGA. 1A–1D illustrates the method steps of the present invention of gettering a semiconductor wafer with a laser;

FIGS. 3A–3G illustrates how the laser gettering technique of the present invention may be applied to the fabrication of a semiconductor device;

DETAILED DESCRIPTION

Figure 1:
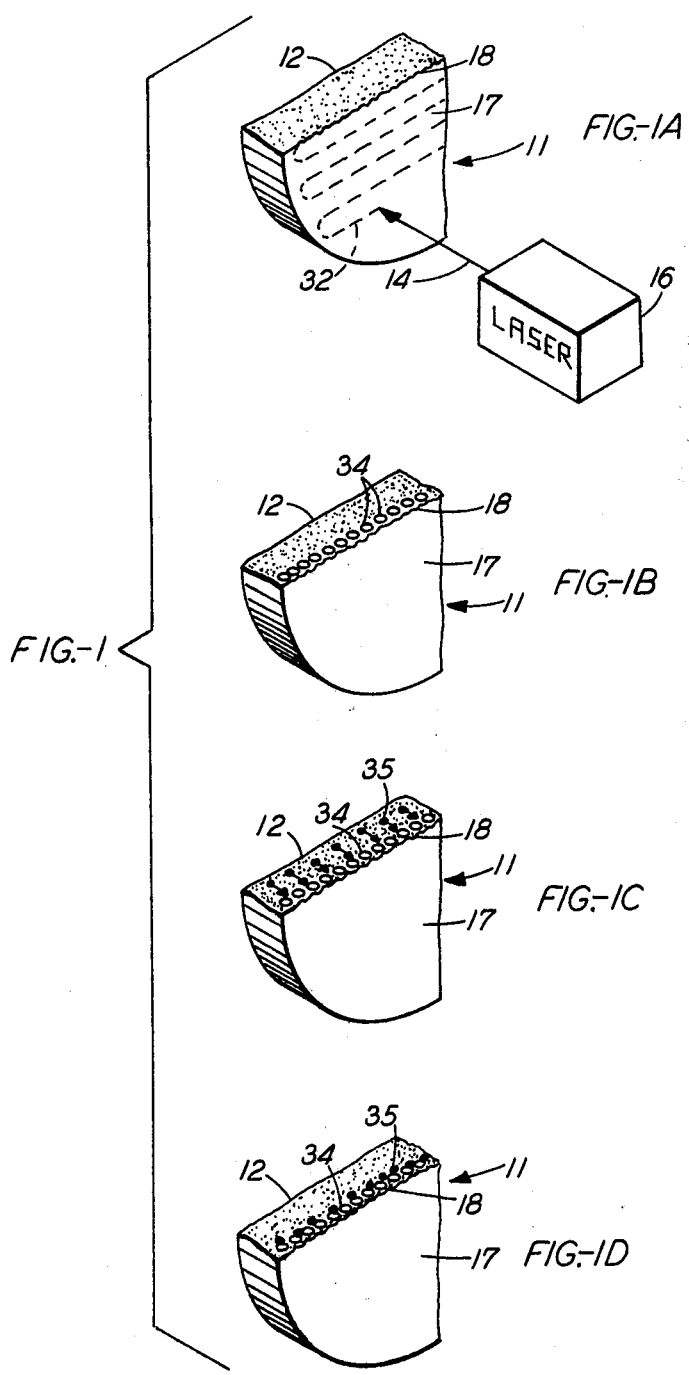

Referring now to FIG. 1 and, in particular, to FIG. 1A, a portion of a semiconductor wafer, designated generally by 11, is shown. The wafer 11 may be at any process step in its fabrication into semiconductor devices so long as the step is prior to the separation of the wafer 11 into individual semiconductor devices, such as transistor or integrated circuit chips. In other words, the wafer 11 may be a pre, a mid or a post process wafer.

Typically, the wafer 11 is substantially circular in configuration and is usually made by sawing a single crystalline semiconductor ingot into a plurality of thin wafers. Frequently, the semiconductor material of the wafer 11 is silicon. But is is to be understood that the invention is equally applicable to other materials such as germanium, gallium phosphide, gallium arsenide or the like.

The wafer 11 has an active side or front surface 12 where semiconductor devices, such as transistors, integrated circuits or the like, are to be formed. After the fabrication of such devices, the wafer 11 is separated into the individual devices by conventional techniques, such as scribing and breaking or sawing, that are well known in the prior art.

In accordance with the present invention, a high energy beam is directed onto the opposite side or back surface 17 of the wafer 11.

The high energy beam may be any such beam known in the prior art so long as it is absorbed at the surface of the wafer 11 and does not pass substantially through it. Ideally, such a beam is a laser beam 14 from a source, such as a laser 16. However, other beams from other sources may be used such as, for example, a high energy beam of the proper wave-length and intensity, such as the output from an incoherent mercury arc lamp.

In some applications the laser beam 14 may be directed to the front surface 12 of the wafer 11 so long as the beam 14 does not impinge the portions of the front surface 12 where devices are to be actually formed.

The laser beam 14 damages the back surface 17 of the wafer 11 by vaporizing the material of the wafer 11, typically to a depth of 5 to 15 microns. Conveniently, the damage is in the form of substantially uniform spots or shallow holes. In other words, the damage is intensified at these spots or holes which, depending on the particular application, may be closely spaced to, or overlap, each other. It should be noted that the overlapping of the spots produces maximum amounts of damage.

In damaging the wafer, the laser beam 14 produces a lattice strain in the region of the damage, as shown by the pattern 18 of FIG. 1B.

Figure 2:
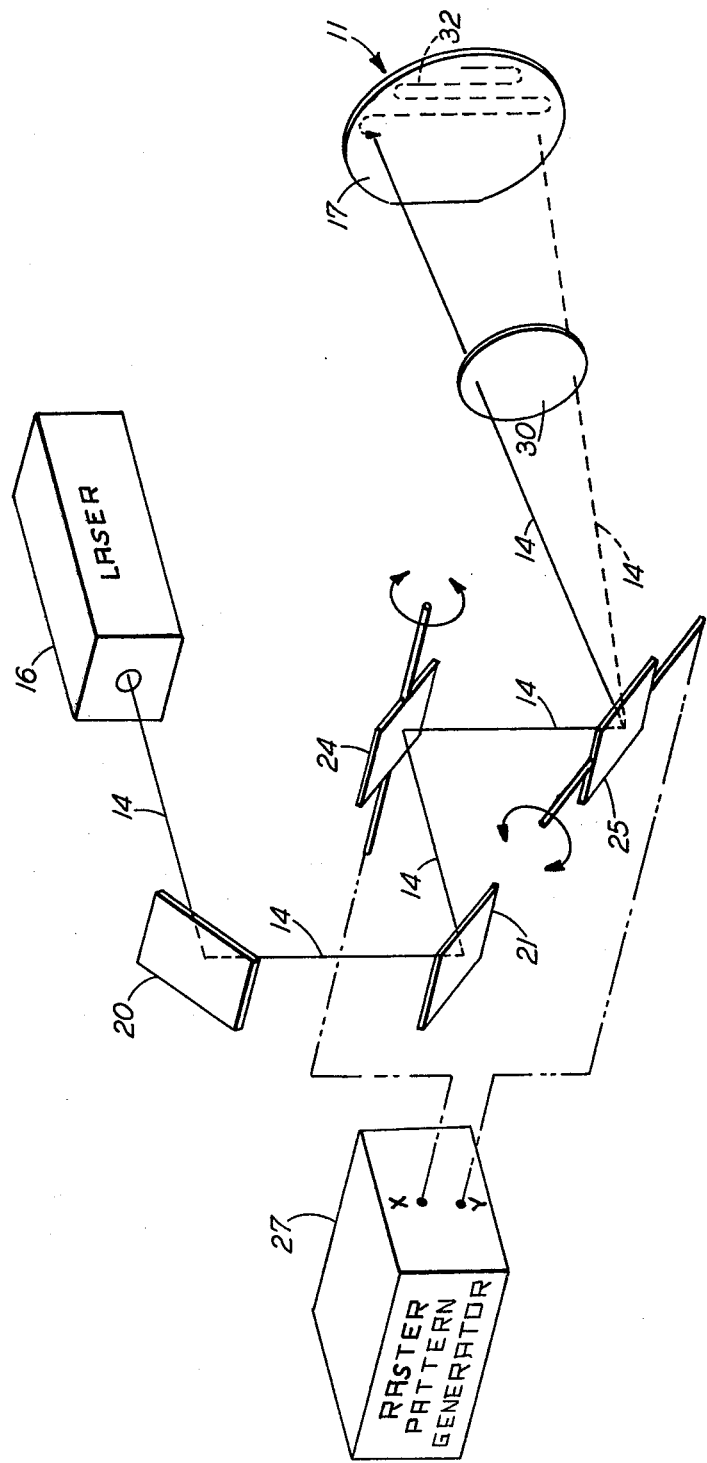
FIG. 2 is a schematic representation of an apparatus which may be used for directing a laser beam on a semiconductor wafer in accordance with the present invention.

The laser 16 is shown in more detail in the schematic representation of FIG. 2. Typically, the laser 16 is a repetitively Q-switched Nd:YAG laser with a power level of about 8 to about 150 watts. Of course, other lasers may also be used.

In FIG. 2, the beam 14 is shown being directed from the laser 16 to a first stationary 45°-angle mirror 20 and then to a second 45°-angle stationary mirror 21. From the mirror 21, the beam 14 is directed to a first oscillating mirror 24 and then to a second oscillating mirror 25.

A raster pattern generator 27 produces X and Y signals to control the oscillations of the mirror 24 and 25. These oscillations are such that when the laser beam 14 is directed through a lens 30, which focuses the beam 14, the beam 14 traces a raster pattern 32 on the back surface 17 of the wafer 11, as shown in FIG. 2. By so tracing the raster pattern 32, the back surface 17 is blanket damaged.

To reduce the time required to raster scan the wafer 11, it is to be understood that mutliple lasers 16 may be used. Also, increased laser energy would produce larger damage spots and thus reduce such time.

The following table shows typical parameters for inducing lattice damage on the back surface of a typical wafer (a silicon wafer 3 inches in diameter and 0.20 inch thick) with a laser in accordance with the present invention:

| Laser: Nd:YAG, 8 Watts - Continuous Wave, $TEM_{oo}$ (fundamental transverse electromagnetic mode) | | | |
|---|---|---|---|
| Repetition Rate: | 10 kHz | 20 kHz | 20 kHz |
| Machined Spot Diameter: | 60 μm | 45 μm | 45 μm |
| Spot Overlap: | 0% | 30% | 70% |
| Damage: | Light | Moderate | Heavy |
| Dislocation: | | | |
| Density: | 75/mm | 300/mm | >1000/mm |
| Propagation Distance: | 15 μm | 50 μm | 250 μm |

After the wafer 11 has been damaged by the laser beam 14, the wafer is subjected to a heat treatment. This produces a dislocation array or mesh 34 (FIG. 1B) to relieve the strain caused by the damage. The heat treatment typically may be accomplished by placing the wafer 11 in a furnace and heating the wafer 11 to a temperature of about 700° C. to about 1250° C. for about ½ hour or more. The heat treatment normally is accomplished by a subsequent processing step required in the fabricating of semiconductor devices, but can be a separate step if necessary. An example of such subsequent step is a diffusion operation which requires heat treatment.

During the heat treatment, mobile defects which may be point defects such as contaminant atoms, and which may include volume defects, such as saucer pits, are attracted to the mesh 34, as shown in FIC. 1C.

The result is the finished wafer 11 shown in FIG. 1D where the mobile defects 35 remain on the back surface 17 of the wafer 11 and are not in a position to degrade device characteristics.

Referring now to FIG. 3, a prior art process known in the industry as the Standard Buried Collector process, which is a bipolar process, is illustrated. In connection with this prior art process, the present invention will be described, showing how such process may incorporate pre, mid or post process laser induced lattice damage.

In FIG. 3A, there is shown the wafer 11, which has been sawed from an ingot, lapped, polished and cleaned in accordance with techniques known in the art of manufacturing semiconductor devices. The wafer 11 has a layer 37 of silicon dioxide formed on its front surface 12 by conventional oxidizing techniques. Often the layer 37 is also formed on the back surface 17.

Next, as illustrated in FIG. 3B, buried collectors 39 are formed using techniques known in the art. In forming these collectors 39 holes are made in the oxide layer 37 and the collectors 39 are driven into the wafer 11 by diffusion or ion implantation. After the collectors 39 are so formed, the oxide layer 37 is removed.

As shown in FIG. 3C, an epitaxial layer 41 is then grown on the wafer 11 and over the buried collector 39 in accordance with the prior art.

Next, individual semiconductor devices are isolated from each other by a boron diffusion that forms isolation regions 42, as shown in FIG. 3D.

Then, by phosphorus diffusion deep collector contacts 44 are formed in the epitaxial layer 41, as illustrated in FIG. 3E. These contacts 44 are contiguous to the collectors 39. It should be noted that the scale of FIGS. 3E, F and G is expanded.

In FIG. 3F, a base region 46 is shown formed in the epitaxial layer 41 by conventional techniques of the prior art. Finally, the emitter region 47 is formed in the base region 46 using conventional techniques of the prior art, as shown in FIG. 3G. This results in forming a plurality of transistors 49 in the wafer 11, only one of which is shown in FIG. 3G.

Pre process gettering is applied to the starting wafer 11 prior to the formation of the oxide layer 37, shown in FIG. 3A. Mid process gettering is applied at any process point but is usually accomplished prior to the base or emitter diffusion steps. Post process gettering is applied after all diffusion and oxidation steps have been performed.

Significantly, each gettering step in accordance with the present invention reduces defects in the wafer 11 and improves the yield of semiconductor devices from the wafer 11. Such gettering step, which may be applied pre, mid or post process, is accomplished without contaminating the wafer, and with a high degree of uniformity. Such gettering step, which is readily refreshable, is accomplished with great control and with little likelihood of breakage of the wafer 11.

Although gettering steps in accordance with the present invention have been described with respect to the manufacture of bipolar semiconductor devices, it should be understood that it is equally applicable to MOS (Metal Oxide Semiconductor) devices.

Figure 4:
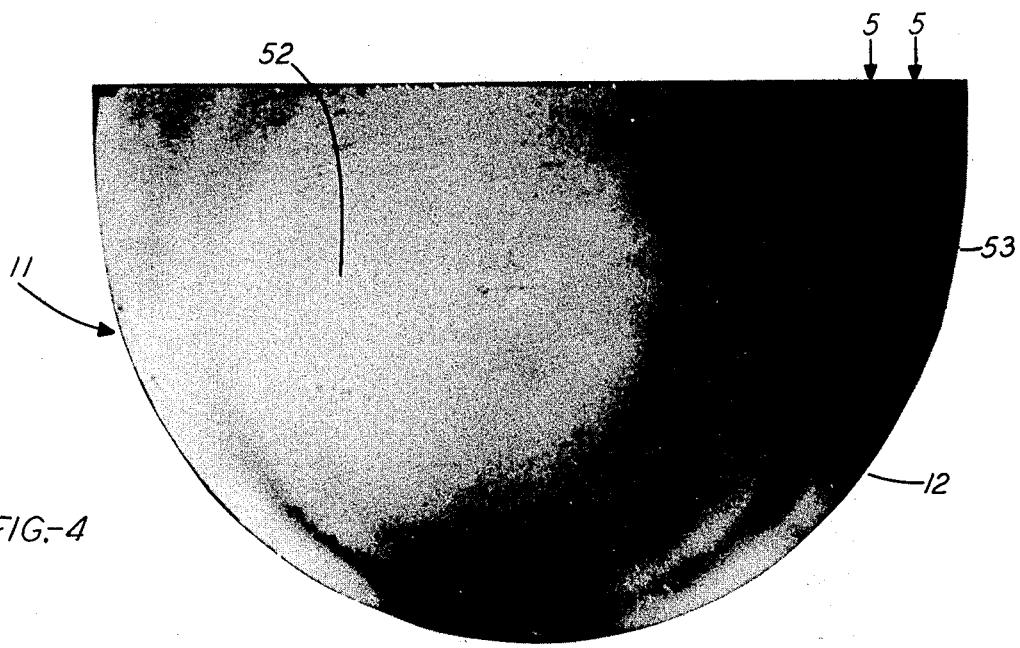
FIG. 4 is a macrophotograph with about a 1.5 magnification of a portion of a silicon wafer, comparing a laser gettered portion of a wafer with a non-laser gettered portion.

Referring now to FIG. 4, a macrophotograph with about 1.5 magnification is shown of approximately one-half of a silicon wafer, referred to generally by 11. The wafer 11 is shown with its front or active surface 12 facing up.

A milky-white haze 52 on the front surface 12 represents minute, mobile defects known in the art as saucer pits which are visible after a preferential etch. The area of the back surface 17 (FIGS. 1 and 5) of the wafer 11 opposite to the haze 52 has not been gettered in accordance with the present invention. On the other hand, the area of the back surface 17 opposite to a darkened portion 53 has been gettered in accordance with the present invention. Such darkened portion 53 indicates that the mobile saucer pits have migrated to the back surface 17 so as to not interfere with the semiconductor devices that are to be later formed on the portion 53 of the front surface 12.

Figure 5:
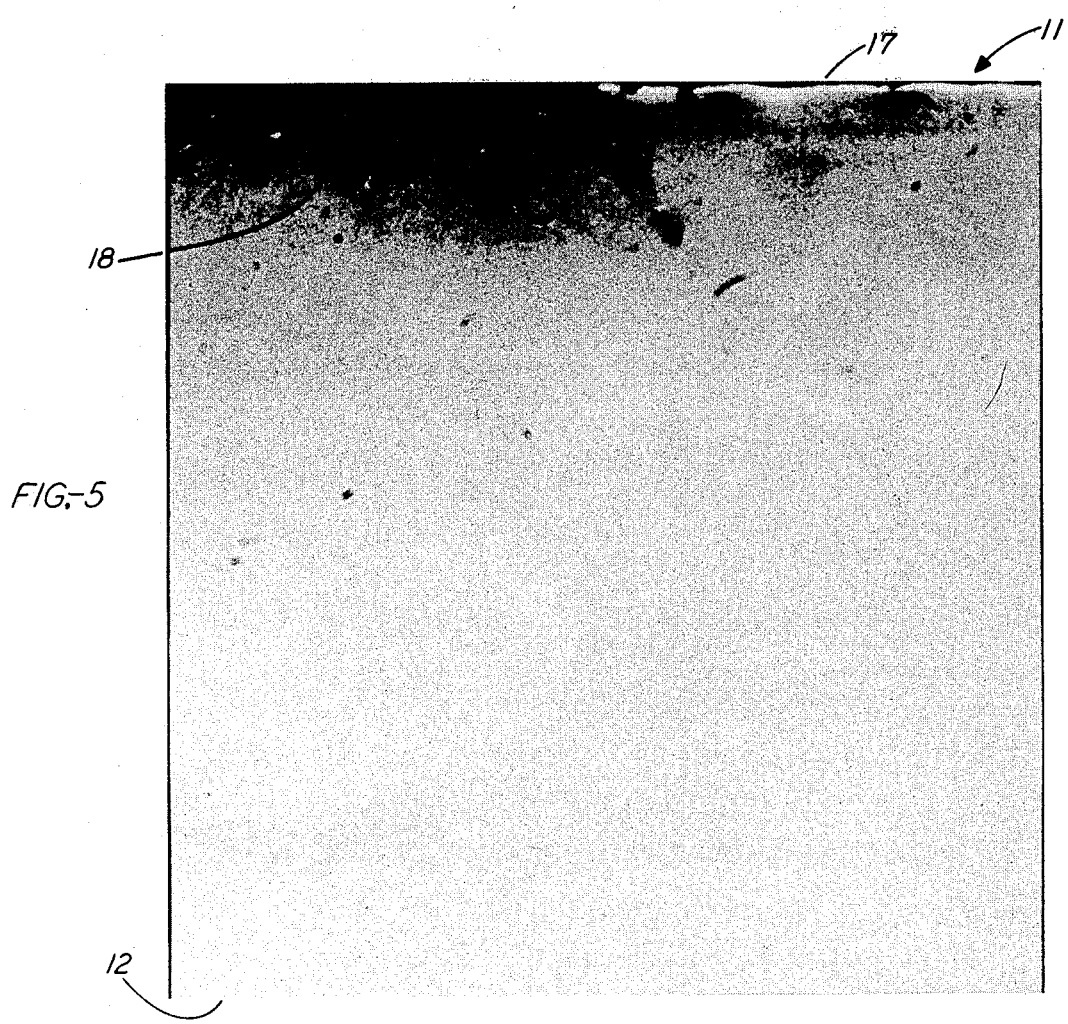
FIG. 5 is a microphotograph with about a 320 magnification of a portion of a cross-sectional area of the photograph of FIG. 4, viewed along lines 5—5 of FIG. 4, comparing a laser gettered portion of the wafer with a non-laser gettered portion.

FIG. 5 shows a portion of a cross-sectional area of wafer 11 of FIG. 4, viewed along 5—5 of FIG. 4 and magnified about 320 times. Such cross-sectional area is shown at the junction of the darkened portion 53 with the haze 52. The pattern 18 resulting from the laser beam 14 and located opposite to the darkened portion 53 is shown exaggerated in FIG. 5 due to the subjection of the wafer 11 to a conventional etching process. It is toward this portion 18 that the mobile defects migrate.

Understanding the invention will be enhanced by the following specific examples.

Two lots of twelve epitaxial wafers each were processed through the Standard Buried Collector process. With respect to each lot, prior to emitter diffusion, but after base diffusion, the back surfaces of eight wafers were laser damaged (post base gettered) in accordance with the present invention as follows: four of these wafers had their back surfaces laser damaged prior to any high temperature processing (pre gettered and post base gettered) and four of these wafers were normal starting wafers (post base gettered only). The four remaining wafers of each lot received no laser damage (control, no gettering).

Instead of forming semiconductor devices on the wafers, a test pattern of the type used for (LSI) Large Scale Integration was used to evaluate improvements in semiconductor junction yields. The test pattern was formed of 600 small (15 × 17 microns) emitters coupled in parallel on a single base. Total emitter area was 270 mils$^2$. An automatic test set was used to perform a number of tests on the structure to measure junction quality. The overall junction yield for each chip of the test pattern is judged good when $BV_{CES}$, $BV_{ECS}$ and $BV_{EBO}$ (measured at 10 microamperes) are all 5.5 volts or greater, where BV is breakdown voltage, CES is a measurement between the collector and emitter with the base shorted to the emitter and EBO is a measurement made on a transistor between the emitter and the base with the collector unconnected (floating). The density of dead shorts (pipes) is determined by requiring that $BV_{CEO}$ is greater than or equal to 5.5 volts at 100 microamps, where CEO is a measurement made on a transistor between the collector and the emitter with the base unconnected (floating).

The following table shows the percent yields obtained on two of the tests applied to the test patterns:

| Wafer Numbers | Treatment | Overall Junction Yield (Pipes & Leakage) | $BV_{CEO}$ Yield (Pipes Only) |
|---|---|---|---|
| | Lot No. 1 of 12 Wafers | | |
| 1-4 | (1) Pre gettered and Post base gettered | 75% | 85% |
| 5-8 | (2) Post base gettered only | 77% | 92% |
| 9-12 | (3) Control, no gettering | 67% | 75% |
| | Lot No. 2 of 12 Wafers | | |
| 13-16 | (1) Pre gettered and Post base gettered | 45% | 91% |
| 17-20 | (2) Post base gettered only | 57% | 89% |
| 21-24 | (3) Control, no gettering | 33%* | 90% |

*Lower than normal due to process problems.

In both lots the overall junction yield was significantly improved by inducing lattice damage with a laser in accordance with the present invention. The predominant junction failure mode differed between the two gettering treatments but the gettering was successful in both lots. Post base gettering appears superior to pre and post base gettering. A possible explanation of this may be that the redamaging of a region containing gettered impurities releases them to diffuse to the front side of the wafer.

It is to be understood that the above-described arrangements are simply illustrative of the application of the principles of the invention. Numerous other arrangements may readily be devised by those skilled in the art which embody the principles of the invention and fall within its spirit and scope.

What is claimed is:

1. A method of making semiconductor devices in one surface of a wafer, which includes at least two diffusion and simultaneous heating steps, comprising:

directing a laser beam on the opposite surface of the wafer so that such surface absorbs such beam to vaporize spots of the wafer and form shallow overlapping holes to produce lattice damage intensification and strain in the region of such surface, the laser beam being directed either before the diffusion and heating steps or between the two diffusion and heating steps or after the heating and diffusion steps;

scanning in a raster pattern such opposite surface with such beam while it is so directed to blanket said surface with the lattice damage intensification; and heating the wafer at a temperature and for a time sufficient to produce a dislocation array adjacent to the region of damage intensification to relieve the strain and attract mobile defects in the wafer toward the array and away from the surface of the wafer on which the devices are to be formed, the combination of the laser produced damage intensification and heating contactlessly gettering the wafer to reduce defects in the semiconductor devices made from the wafer without contaminating the wafer.

2. The method of claim 1, wherein the wafer is heated at a temperature of about 700° C. to about 1250° C. for a time of about ½ hour.

* * * * *